United States Patent [19]

Sasa et al.

[11] Patent Number: 5,068,689
[45] Date of Patent: Nov. 26, 1991

[54] METHOD FOR TRANSFERRING IMAGES AND AN APPARATUS USED THEREFOR

[75] Inventors: Nobumasa Sasa; Kunio Shimizu; Manabu Watanabe, all of Hino, Japan

[73] Assignee: Konica Corporation, Tokyo, Japan

[21] Appl. No.: 591,751

[22] Filed: Oct. 2, 1990

[30] Foreign Application Priority Data

Oct. 4, 1989 [JP] Japan ................................ 1-259320

[51] Int. Cl.⁵ .................... G03B 27/30; G03B 27/02
[52] U.S. Cl. ...................................... 355/107; 355/132
[58] Field of Search ................. 355/79, 85, 104, 107, 355/117, 132, 133, 77

[56] References Cited

U.S. PATENT DOCUMENTS 4,868,919  9/1989  Tanaka et al. ................. 355/100 X
4,962,314  10/1990  Hirota et al. .................. 355/100 X

*Primary Examiner*—Richard A. Wintercorn
*Attorney, Agent, or Firm*—Frishauf, Holtz, Goodman & Woodward

[57] ABSTRACT

The invention provides a method of transferring an image from a transferring medium onto a record sheet. The method includes steps of setting a record sheet on a rotatable drum; superposing a transferring medium, in which only an image to be transferred is formed on a support material of the transferring medium, on the record sheet; and pressing the transferring medium and the record sheet onto the drum by a pressing roller while rotating the drum so that only the image is transferred to the record sheet.

7 Claims, 12 Drawing Sheets

FIG. 5(a)
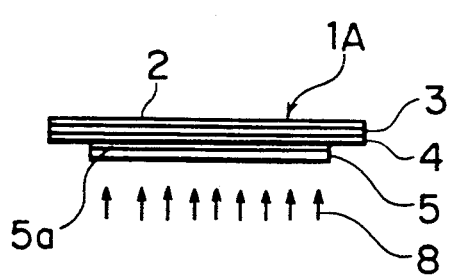
FIG. 5(b)
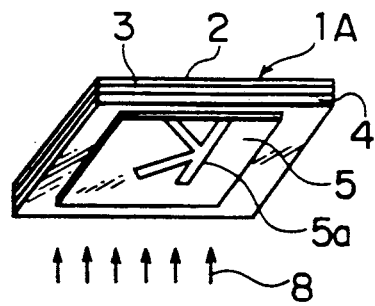
FIG. 5(c)
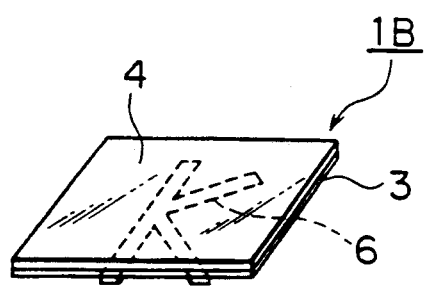
FIG. 5(d)
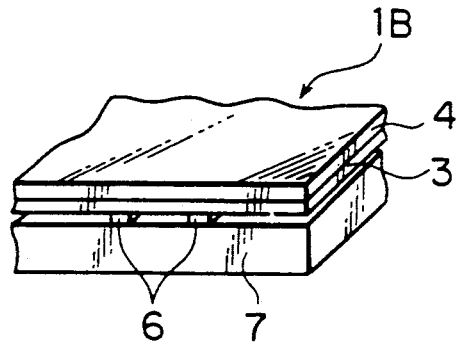
FIG. 5(e)
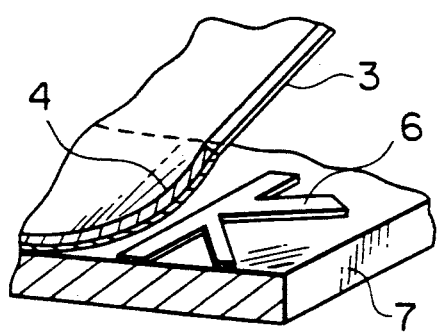
FIG. 5(e')
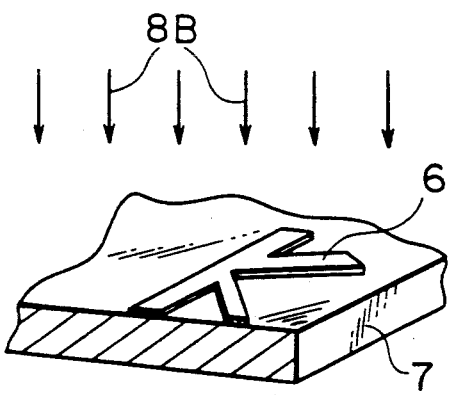
FIG. 5(f)
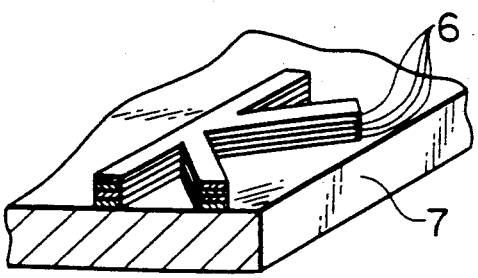

FIG. II(a)
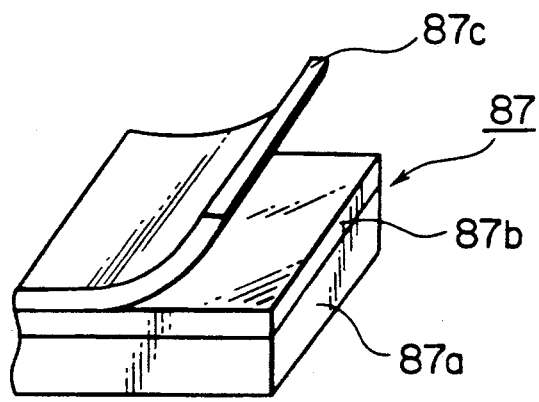
FIG. II(b)
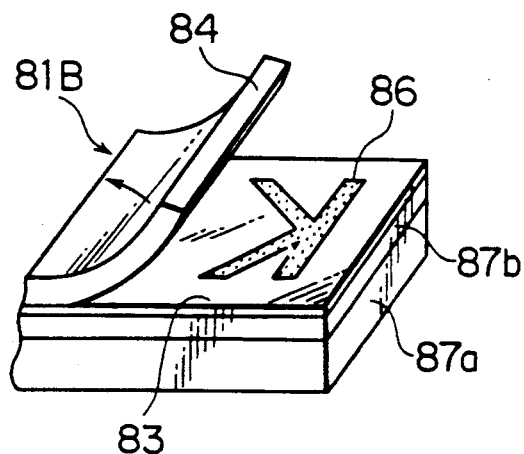
FIG. II(c)
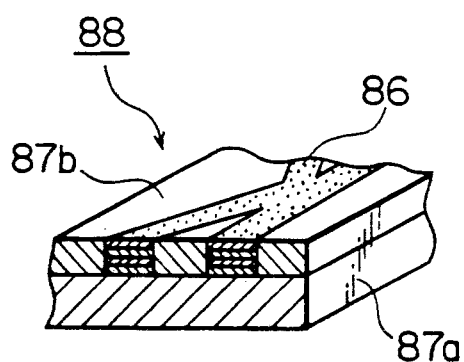
FIG. II(d)
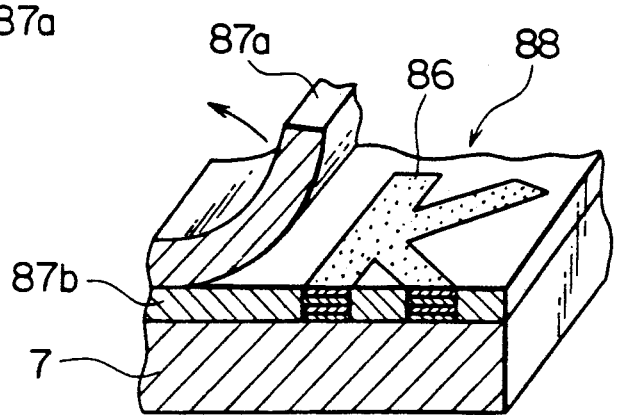

METHOD FOR TRANSFERRING IMAGES AND AN APPARATUS USED THEREFOR

FIELD OF THE INVENTION

The present invention relates to a method for transferring images, such as an image transfer process for making color proofs in color printing, and also relates to an image transfer apparatus for use in the preparation of color proofs.

BACKGROUND OF THE INVENTION

It is well-known that a color sheet (also called color proof) for color correction is used in order to save time and labor in making galley proofs that takes place as a step prior to the production run printing in a multicolor printing process.

Since the color sheet or color proof in itself is used to estimate the color reproduction of finished prints, the color reproduction thereof must closely resemble the of final prints.

Methods for preparing multicolor transfer images by using color sheets include the direct transfer process described in Japanese Patent Publication Open to Public Inspection (hereinafter referred to as Japanese Patent O.P.I. Publication) No. 41830/1972, wherein component colors of an image are directly transferred to be superposed on a final image-receiving paper (copying paper); the indirect transfer process described in Japanese Patent O.P.I. Publication No. 97140/1984, wherein component colors of an image are first transferred to be superposed on a provisional image-receiving sheet, and then the full color image is again transferred onto a final image-receiving sheet: and the method described in Japanese Patent O.P.I. Publication No. 501217/1981, wherein after a colored light-sensitvie layer is transferred onto an image-receiving layer, an image forming process is repeated.

In these methods, the surface of the image transfer sheet is covered with a thermoplastic organic polymer which is transferred with an image, so that the obtained image surface is too glossy to thus, giving the impression of being different from the image quality of the final prints.

The preparation of color proofs in the prior art is made in accordance with, for example, the following procedure:

As is shown in FIG. 10 (a), a colored light-sensitive sheet 81A comprising a polyethylene terephthalate (PET) film 84 having thereon in sequence a removable layer 83 and a colored light-sensitive layer 82 is used. As is shown in FIG. 10 (b), colored light-sensitive sheet 81A is contacted with a positive film original 5 as an exposure mask and exposed to ultraviolet light shown by arrows 8, and the imagewise exposed colored light-sensitive sheet is then developed to obtain an image 86 formed on image sheet 81B as shown in FIG. 10 (c). In the same manner, image sheets 81B are separately prepared for four colors; black (BK), cyan (C), magenta (M) and yellow (Y).

Where a positive image is formed from a positive original with a normal development as in the above, an o-naphthoquinonediazide compound is used as a light-sensitive compound for preparation of the image sheet.

The o-naphthoquinonediazide compound usually assumes an yellow color and has the property of becoming colorless, transparent by photodecomposition. When the o-naphthoquinonediazide compound is used as a light-sensitive material for making the above positive color proof, an area capable of becoming a colored image portion after exposure and development is the unexposed area composed of the undecomposed o-naphthoquinonediazide compound. For this reason, the color of the formed image portion appears to be black, cyan, magenta and yellow colors each tinged with the yellow color of the o-naphthoquinonediazide compound which remains undecomposed.

Since the color proof should essentially be used for the purpose of precise color correction as mentioned above, the aforementioned undesirable yellow color component needs to be removed. Therefore, after the development for the four component colors or after the image transfer, another exposure had to be made to decompose the undecomposed o-naphthoquinonediazide compound. This procedure complicates the color proof making process—particularly in the case of transferring a four color-component image. Specifically it requires a considerable exposure time to complete the decomposition of the o-naphthoquinonediazide compound in the lowest layer due to the absorption of light by pigments.

Next, in the prior art the image-formed image sheet 81B and image-receiving sheet 87 are brought into contact with each other as shown in FIG. 12B, and these sheets are heated and pressured by being passed between a pair of juxtaposed heater-built-in rollers 92 and 93 which are heated by auxiliary outer heaters 94 as shown in FIG. 12A, whereby the image on image sheet 81B is transferred onto image-receiving sheet 87. When this procedure is repeated four times to transfer four component colors onto one image-receiving sheet 87, a full color image is formed on the image-receiving sheet. In FIG. 12A, the pair of rollers 95 are transport rollers and 96 is a cooling fan. The full color image thus formed on the image-receiving sheet is then transferred by the above-mentioned apparatus onto a copy paper, whereby a color proof is prepared.

FIG. 11A-11D schematic drawings which outline of the above prior art transfer process. Prior to starting the transfer, a protective film 87c is peeled off from the image-receiving sheet 87 as shown in FIG. 11(a). The image-receiving sheet 87 comprises PET film 87a having a photopolymerizable image-receiving layer 87b coated thereon. Subsequently, the image sheet 81B of FIG. 10(c) is superposed on the photopolymerizable image-receiving layer to have its image transferred thereonto by using the transferring apparatus of FIG. 12A, and the PET film 84 is then peeled off from the image sheet 81B, as shown in FIG. 11(b). This procedure is repeated four times as stated above, whereby a full color image-receiving sheet 88 of FIG. 11(c) bearing four component color images 86 can be obtained. Then, on a copying paper 7 is superposed the image-receiving sheet 88 as shown in FIG. 11(d) to transfer the full color image 86 onto the copying paper 7 in the same manner as above, and the PET film 87a of the image-receiving sheet is peeled off. The color proof thus obtained is of a construction wherein photopolymerizable image-receiving layer 87b is present together with the full color image 86. The photopolymerizable image-receiving layer 87b, since it is viscous, is then exposed to ultraviolet rays to be polymerized for hardening.

The above hardened photopolymerizable image-receiving layer causes the aforementioned undesirable gloss of a color proof. In order to reduce the gloss, the color proof is then subjected to matting treatment, but it is still difficult to obtain an image closely resembling that of an original.

Also, any of the above-mentioned conventional methods have the disadvantage that the removability of the color image from the support is difficult. After transfer of the color image, removal of the remaining image from the support must be made very carefully, otherwise, part of the color image may, which was not transferred onto the copying paper, sometimes remain on the support.

In addition, in the transfer apparatus of FIG. 12A, in order not to have the paper or respective sheets become creased, a reinforcing plate such as a thick aluminum plate as shown in FIG. 12B is used on which are superposed the respective sheets 7 and 88 or 87 and 81B. Since a thick reinforcing plate is used in this way and the transfer is performed on a plane as shown in FIG. 12A, it is necessary to provide a pair of transport rollers 95 and 95 inside the transfer apparatus, and to provide a feeding tray 97 and receiving tray 98 outside the apparatus body. Accordingly, the apparatus' size increases, and the feeding and receiving operations are made in front and in the rear of the apparatus, so that the reinforcing plate 99 must be moved each time when one transfer operation is performed, thus causing the transfer operation to be inefficient and to take time.

SUMMARY OF THE INVENTION

It is an object of the present invention to provide a method for transferring an image which is capable of fully transferring onto a copying paper an image to be transferred from a transfer medium and form an image which closely resembles to that of an original.

It is another object of the present invention to provide a method for transferring an image and a transfer apparatus to be used therefor which enable minimization of the work space and improves the transfer work efficiency.

The present invention relates to a method for transferring an image onto a copying sheet without transferring a removable layer onto said copying sheet which comprises: subjecting a transfer medium having an image formed on its support and a copying sheet in contact therewith to pressure treatment or heating and pressure treatment to transfer said image onto said copying sheet said support is provided with a transfer medium having said image alone formed thereon: said copying sheet is mounted on a rotatable drum-like pressure-receiving element: said transfer medium is superposed on said copying sheet: and said pressure-receiving element is rotated to thereby perform said transfer operation.

The above term 'support', when an intermediate layer such as a removable layer is present on the back of the image, includes the intermediate layer.

The invention also relates to an image transfer apparatus which subjects a transfer medium comprising a support having an image formed thereon and a copying sheet in contact therewith to pressure treatment or heating and pressure treatment to thereby transfer said image onto said copying sheet, said image transfer apparatus comprising at least a rotatable drum-like pressure-receiving element for setting said copying sheet thereto, a means for performing said pressure treatment or said heating and pressure treatment, and an exposure means to expose said image to light.

BRIEF DESCRIPTION OF THE DRAWINGS

FIGS. 1 to 5 illustrate examples of the present invention:

FIG. 1 is a schematic front view of a princial part of a transfer apparatus.

FIG. 2 is a front view showing the inside of the transfer apparatus.

FIG. 3 is a left side view of the apparatus.

FIG. 4 is a cross-sectional view as seen in the direction of arrows from the line IV—IV of FIG. 2.

FIGS. 5(b), 5(c), 5(d), 5(e), 5(e') and 5(f) are schematic perspective views showing the steps of preparing an image sheet, and 5(a) is a schematic front view as seen in the condition of 5(b).

FIGS. 10 through 12A and 12B illustrate prior art conventional examples:

FIGS. 11(a), 11(b), 11(c) and 11(d) are schematic perspective views showning part of the steps of preparing a color proof.

FIG. 12A is a front view of the inside of a transfer apparatus.

FIG. 12B is a perspective view of a reinforcing plate used for the transfer apparatus of FIG. 12A.

DESCRIPTION OF THE PREFERRED EMBODIMENTS

Figure 1:
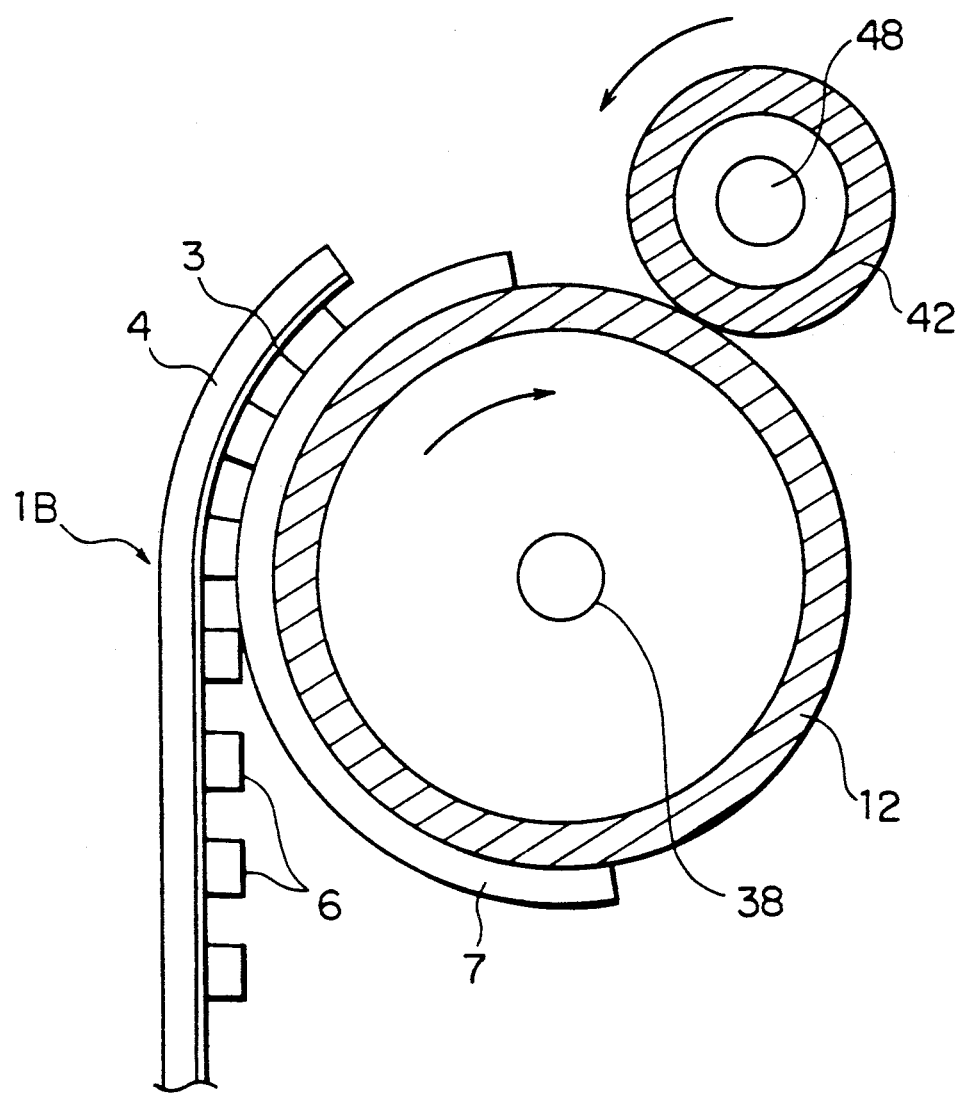

Examples of the present invention are illustrated below:

Firstly, an image-forming medium (colored light-sensitive film) for prepareing a transfer medium suitable for the present invention is explained in detail.

The colored light-sensitive material comprises a transparent support having thereon a colored light-sensitive layer for forming an image. And, in order to facilitate transfer of the image onto a copying sheet such as art paper and removal of the support after the transfer, it is preferable to form an intermediate layer (removable layer) for giving peelability between the support and the colored light-sensitive layer.

As the transparent support, a polyester film such as particularly a biaxially stretched polyethylene terephthalate film is suitable due to its dimensional stability when subjected to water and heat, but acetate film, poly(vinyl chloride) film, polystyrene film, polypropylene film and polyethylene film may also be used.

As the removable layer, for example, an ethylene-vinyl acetate copolymer resin layer may be provided. An ethylene-vinyl acetate copolymer resin layer need only have a minimum thickness to cover the surface of the support, and there is no restrictions to its thickness. However, the layer is preferably thinner than the support.

In the ethylene-vinyl acetate copolymer resin, the vinyl acetate preferably accounts for 5 to 33% by weight of the whole resin, and the VICAT softening point of the resin is preferably not more than 80° C. Regarding the ethylene-vinyl acetate resin of the invention, as long as its softening point does not exceed 80° C., other polymers may be added, as well as supercooling substances, surface active agents, mold lubricants, and the like.

Methods for providing the ethylene-vinyl acetate copolymer resin onto the support include:

1) a method for providing an ethylene-vinyl acetate copolymer resin layer wherein a solution of the ethylene-vinyl acetate dissolved in an organic solvent such as toluene is coated on a support and then dried:

2) a dry laminating method wherein a solution of poly(vinyl acetate), poly(vinyl chloride), epoxy resin, polyurethane resin, natural rubber or synthetic rubber dissolved in an organic solvent is used as an adhesive, the adhesive is coated on a support and then dried in hot air or by heating, and an ethylene-vinyl acetate copolymer resin film is laid on the support and both are pressured and heated for laminating;

3) a hot-melt laminating method wherein a mixture of ethylene-vinyl acetate copolymer, ethylene-acrylate copolymer, polyamide resin, petroleum resin, rosins and waxes is used as an adhesive, the adhesive is heated and kept molten to be coated on a support by a doctor blade coating method, roll coating method, gravure coating method or reverse roll coating method, the coated support is immediately stuck onto an ethylene-vinyl acetate copolymer resin film, and if necessary they are once heated to a high temperature and then cooled:

4) an extrusion laminating method wherein ethylene-vinyl acetate copolymer resin is kept molten and extruded by and through an extruder into a film, which, while in a molten state, is laminated on the support by application of pressure thereto: and 5) a coextrusion method wherein a plurality of extruders are used to extrude simultaneously both a molten material to form a support film and a molten ethylene-vinyl acetate copolymer resin film to thereby form a ethylen-vinyl acetate copolymer resin film on the support film in one forming operation.

The colored light-sensitive material is imagewise exposed and developed to be removed imagewise to thereby form a colored image.

As the light-sensitive component contained in the colored light-sensitive layer there may be used various compounds which include all compounds such as monomers, prepolymers and polymers. These compounds when exposed to an activating light, immediately change their molecular structures chemically so that their solubilities in solvents are changed. Thus when a certain solvent is applied thereto, the exposed or nonexposed area can be dissolved to be removed. Usable examples of the light-sensitive component include photo-crosslinkable resins whose solubility is reduced when exposed to light, the so-called negative-positive type, such as poly vinyl alcohol cinnamic acid esters: mixtures of diazonium salts or condensates thereof with poly vinyl alcohol, poly(vinyl pyrrolidone), polyacrylamide, etc.: mixtures of aromatic azide compounds such as photo-crosslinkable agents with cyclorubbers as binders: and light-sensitive resins which utilizes photoradical polymerization or photo-ionic polymerization. In addition, there are those in which the solubility in a solvent increases when exposed to light, the so-called positive-positive type. For example, light-sensitive resin compositions may comprises o-quinonediazide as a light-sensitive substance, those condensates of a hydroxyl group and/or amino group-containing compounds with 1,2-benzoquinonediazido-4-sulfonyl-chloride, 1,2-naphthoquinonediazido-4-sulfonyl-chloride, 1,2-naphthoquinonediazido-5-sulfonyl-chloride, and 1,2-naphthoquinonediazido-6-sulfonylchloride may be suitably used.

As the above hydroxyl group-containing compound there are, for example. trihydroxybenzophenone, dihydroxyanthraquinone. bisphenol A, phenol novolac resin, m-cresol-formaldehyde novolac resin, p-cresol-formaldehyde novolac resin, m-cresol-p-cresol-formaldehyde copolycondensate resin, resorcinol-benzaldehyde condensate resin, pyrogallol-acetone condensate resin, and the like. Among these resins, trihydroxybenzophenone-p-cresol-formaldehyde novolac resin may be suitably used. And as the above amino group-containing compound there are, for example, aniline, p-aminodiphenylamine, p-aminobenzophenone. 4,4'-diaminodiphenylamine, 4,4-diaminobenzophenone, and the like.

As for the above o-quinondiazide compounds, those described in J. KOSAR, 'Light Sensitive System' (Wiley & Sons, New York, 1965) and Inui and Matsunaga, 'Kankosei Kobunshi (light-sensitive polymers)' (Kodan-sha, 1977) may also be used.

Further, as ones of the positivie-positive type there may also be used those light-sensitive resin compositions containing i) compounds capable of generating an acid when exposed to an active light: ii) compounds having at least one linkage decomposable by an acid: and iii) novolac resins containing 2 or 3 different phenols.

The above light-sensitive composition content of the colored light-sensitive layer is preferably 5 to 80% by weight.

The colored light-sensitive layer of such the light-sensitive material may contain other light-sensitive components, alkali-soluble resins, dyes, pigments, plasticizers and the like in addition to the o-naphthoquinonediazide component.

Usable as a binder for constituting the colored light-sensitive layer is a high molecular compound having an excellent layer-formability and solubility in a solvent, and preferably capable of being dissolved and swelling in an alkali developer solution.

Examples of the above high-molecular compound include those containing in the molecular structure thereof a structure unit having an aromatic hydroxyl group represented by the following formula:

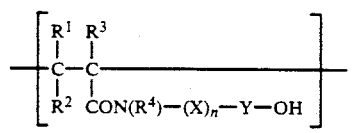

wherein $R^1$ and $R^2$ each represent a hydrogen atom, an alkyl group or a carboxylic acid group: $R^3$ is a hydrogen atom, a halogen atom or an alkyl group: $R^4$ is a hydrogen atom, an alkyl group, a phenyl group or an aralkyl group: X is a divalent organic group to link between a nitrogen atom and an aromatic carbon atom; n is an integer of 0 or 1: and Y is a substitutable phenylene group or a substitutable naphthylene group.

Examples of the monomer to constitute the structure unit represented by the above formula include (metha)a- crylamides such as N-(4-hydroxyphenyl)-(metha)acrylamide, N-(2-hydroxyphenyl)-(metha)acrylamide, and N-(4-hydroxynaphthyl)-(metha)acrylamide monomers: o-, m- or p-hydroxyphenyl(metha)acrylate monomer: o-, m- or p- hydroxystyrene monomer: and the like. Of these the preferred are o-, m- or p-hydroxyphenyl(metha)acrylate monomer and N-(4-hydroxyphenyl)-(metha)acrylamide monomer, and more preferred is the N-(4-hydroxyphenyl)-(metha)acrylamide monomer.

It is preferable to use as the binder a copolymer of one of the following monomers and a monomer for forming the structure having the aromatic hydroxyl group represented by the above formula.

Acrylonitriles:

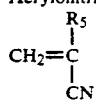

Alkyl acrylates:

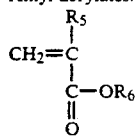

Acrylic acids:

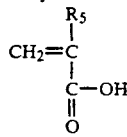

wherein $R^5$ is a hydrogen atom, an alkyl group or a halogen atom: $R^6$ is an alkyl group, a phenyl group or a naphthyl group.

The monomer having the aromatic hydroxyl group represented by the above formula accounts for preferably 1 to 30 mole % of the above copolymer.

The unit formed from the above acrylonitrile accounts for preferably 0 to 50 mole % of the above copolymer, and more preferably 5 to 40 mole % to take into account the developability. The structure unit formed from the above alkyl acrylate accounts for preferably 50 to 95 mole % of the copolymer in view of the developability in a weak alkalin aqueous solution, and most preferably 60 to 95 mole % for giving the best developability.

The above high molecular compound may have the above acrylic acid such as acrylic acid or methacrylic acid copolymerized also with the above mentioned structure unit for the purpose of finely adjusting the developability thereof. The copolymer accounts for preferably 0 to 20 mole % of the high molecular compound, and most preferably 0 to 10 mole % in consideration of the development latitude.

The weight average molecular weight of the above high molecular compound is preferably 1,000 to 100,000, and more preferably 1,000 to 30,000 in view of the developability or resolution when a low alikaline aqueous solution is used as a developer solution. These high molecular compounds can be synthesized in accordance with well-known copolymerization methods.

Examples of the above high molecular compound include those copolymers having the following structural formula:

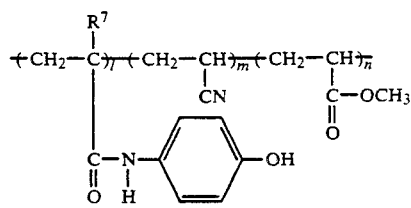

(Weight average molecular weight: 1,000 to 30,000)
l:m:n = (1 to 25):(5 to 40):(50 to 95)

wherein $R^7$ is a hydrogen atom or a methyl group.

In addition, as the binder there may also be used polycondensate resins such as novolac resins that can be obtained by polycondensation of at least one phenol with an active carbonyl compound.

These phenols include all compounds wherein at least one of the hydrogen atoms bonded to the aromatic ring thereof is substituted with a hydroxyl group, such as phenol, o-cresol. m-cresol, p-cresol, 3,5-xylenol, 2,4-xylenol, 2,5-xylenol, carvacrol, thymol, catechol, resorcinol, hydroquinone, pyrogallol. phloroglucinol, and a phenol substituted with an alkyl group having 1 to 8 carbon atoms.

Examples of the above active carbonyl compound include aldehydes and ketones, such as formaldehyde, acetaldehyde, benzaldehyde, acrolein, furfural and acetone.

As the above polycondensate resins there are phenolformaldehyde novolac resin, m-cresol-formaldehyde novolac resin, phenol-m-cresol-formaldehyde copolycondensate resin, phenol-p-cresol-formaldehyde copolycondensate resin, m-cresol-p-cresolformaldehyde copolycondensate resin, o-cresol-p-cresol-formaldehyde copolycondensate resin, phenol-o-cresol-m-cresol-formaldehyde copolycondensate resin, phenol-o-cresol-p-cresol-form aldehyde copolycondensate resin and phenol-m-cresol-p-cresolformaldehyde copolycondensate resin.

The preferred one of these novolac resins is the phenolformaldehyde novolac resin. Regarding the molecular weight of the resin, the weight average molecular weight Mw is preferably 3500 to 500, and the number average molecular weight Mn is preferably 1000 to 200.

Measurement of the molecular weight of the above resin is conducted by gel permeation chromatography (GPC). Calculations of the number average molecular weight Mn and weight average molecular weight Mw should be carried out in accordance with the method for averaging the peaks in the oligomer region (by connecting between the centers of peaks and valleys) as described in Shigeo Tsuge, Tatsuya Miyabayashi and Seishi Tanaka, 'The Chemical Society, Japan' pp.800–805 (1972).

In the above novolac resins, confirmation of the ratio by weight of different phenols used in the synthesis thereof is made by using pyrolysis gas chromatography (PGC). The principle and experimental conditions of the pyrolysis gas chromatography and the apparatus used therefor are described in, e.g. Shin Tsuge, the 'Shin Jikken Koza (New Experimental Course)' compiled by The Chemical Society, Japan, vol.19, Polymer Chemistry [I] 474–485 (1978, Maruzen). The qualitative analysis of novolac resins by pyrolysis gas chromatography should be made in accordance with the method described in Shigeo Tsuge, Takashi Tanaka and Seishi Tanaka, the 'Analytical Chemistry', Vol.18. 47–52 (1969).

Further, other high molecular compounds usable as the binder include sulfoalkyl esters of (metha)acrylic acid (co)polymers, vinyl acetal (co)polymers, vinyl ether (co)polymers, acrylamide (co)polymers, styrene (co)polymers, cellulose derivatives, vinyl acetate (co)polymers, and the like.

In addition, as the light-sensitive composition there may also be used those containing high molecular compounds (A) having in the molecular structure thereof a carboxylic acid vinyl ester polymerization unit having the following formula:

$$RCOOCH=CH_2$$

wherein R is an alkyl group having 1 to 17 carbon atoms.

Preferred examples of the carboxylic acid vinyl ester monomer for constituting the polymerization unit having the above general formula are as follows:

| | | |
|---|---|---|
| (1) | Vinyl acetate | $CH_3COOCH=CH_2$ |
| (2) | Vinyl propionate | $CH_3CH_2COOCH=CH_2$ |
| (3) | Vinyl butyrate | $CH_3(CH_2)_2COOCH=CH_2$ |
| (4) | Vinyl pivalate | $(CH_3)_3CCOOCH=CH_2$ |
| (5) | Vinyl caproate | $CH_3(CH_2)_4COOCH=CH_2$ |
| (6) | Vinyl caprylate | $CH_3(CH_2)_6COOCH=CH_2$ |
| (7) | Vinyl caprate | $CH_3(CH_2)_8COOCH=CH_2$ |
| (8) | Vinyl laurate | $CH_3(CH_2)_{10}COOCH=CH_2$ |
| (9) | Vinyl myristate | $CH_3(CH_2)_{12}COOCH=CH_2$ |
| (10) | Vinyl palmitate | $CH_3(CH_2)_{14}COOCH=CH_2$ |
| (11) | Vinyl stearate | $CH_3(CH_2)_{16}COOCH=CH_2$ |
| (12) | Vinyl versatate | $R^1-\underset{R^2}{\overset{CH_3}{\underset{|}{\overset{|}{C}}}}-COOCH=CH_2$ | where $R^1$ and $R^2$ are alkyl groups of which the total number of carbon atoms is 7: i.e., $R^1+R^2=C_7H_{16}$.

More preferred carboxylic acid vinyl ester monomers are those of which the carboxylic acid's principal chain has 1 to 4 carbon atoms, and the most preferred is vinyl acetate.

The above-mentioned alkyl groups represented by $R^1$ and $R^2$ include substituent-having alkyl groups: i.e., substituted carboxylic acid's vinyl esters also are included in the polymerization unit.

The high molecular compound (A) may be a homopolymer obtained by polymerization of a single kind of carboxylic acid vinyl ester, a copolymer comprised of 2 or more kinds of carboxylic acid vinyl ester, or a copolymer of a carboxylic acid vinyl ester and different other monomers copolymerizable therewith at an arbitrary ratio.

As the monomer unit usable in combination with the polymerization unit having the above formula there are ethylenetype unsaturated olefins such as ethylene, propylene, isobutylene, butadiene, isoprene, etc.: styrenes such as styrene, α-methylstyrene, p-methylstyrene, p-chlorostyrene, etc.: acrylic acids such as acrylic acid, methacrylic acid, etc.: unsaturated aliphatic dicarboxylic acids such as itaconic acid, maleic acid, maleic anhydride, etc.: diesters such as diethyl maleate, dibutyl maleate, di-2-ethylhexyl maleate, dibutyl fumarate, di-2-ethylhexyl fumarate, etc.: α-methylene aliphatic monocarboxylic acid esters such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate, ethyl methacrylate, etc.; nitriles such as acrylonitrile, methacrylonitrile, etc.: amides such as acrylamide; anilides such as acryl anilide, p-chloroacryl-anilide. m-nitroacryl-anilide, m-methoxyacryl-anilide, etc.: vinyl ethers such as methyl-vinyl ether, ethyl-vinyl ether, isobutyl-vinyl ether, β-chloroethyl-vinyl ether. etc.: vinyl chloride, vinylidene chloride, vinylidene cyanide: ethylene derivatives such as 1-methyl-1-methoxyethylene, 1,1-dimethoxyethylene, 1,2-dimethoxyethylene, 1,1-dimethoxycarbonyl-ethylene, 1-methyl-1-nitroethylene, etc.: and N-vinyl compounds such as N-vinyl-pyrrol, N-vinylcarbazole. N-vinyl-indole, N-vinyl pyrrolidene, N-vinyl-pyrolidone, etc.

The above vinyl-type monomer, having a structure with its unsaturated double bond being cleaved, is present in the high molecular compound (A).

Preferred as the high molecular compound (A) are those having a vinyl acetate polymerization unit in the molecular structure thereof. More preferred among them are those containing a 40 to 95 wt % vinyl acetate polymerization unit having a number average molecular weight Mn of 1,000 to 100,000 and a weight average molecular weight Mw of 5,000 to 500,000.

The most preferred are those which contains a 40 to 95 wt % vinyl acetate polymerization unit and a carboxylic acid vinyl ester polymerization unit whose chain is longer than that of the vinyl acetate, and which has a number average molecular weight Mn of 2,000 to 60,000 and a weight average molecular weight Mw of 10,000 to 150,000.

In this instance, a monomer that is polymerizable with the vinyl acetate to constitute a vinyl acetate polymerization unit-having high molecular compound is allowed to be any arbitrary one as long as it can form a copolymer; for example, may be selected from among the above exemplified monomers.

The listed with monomer components shown below are the copolymers usable as the high molecular compound (A) of the invention, but the invention is not limited thereto.

(1) Vinyl acetate-ethylene
(2) Vinyl acetate-styrene
(3) Vinyl acetate-crotonic acid
(4) Vinyl acetate-maleic acid
(5) Vinyl acetate-2-ethylhexyl acrylate
(6) Vinyl acetate-di-2-ethylhexyl maleate
(7) Vinyl acetate-methylvinyl ether
(8) Vinyl acetate-vinyl chloride
(9) Vinyl acetate-N-vinyl pyrolidone
(10) Vinyl acetate-vinyl propionate
(11) Vinyl acetate-vinyl pivalate
(12) Vinyl acetate-vinyl versatate
(13) Vinyl acetate-vinyl laurate
(14) Vinyl acetate-vinyl stearate
(15) Vinyl acetate-vinyl versatate-ethylene
(16) Vinyl acetate-vinyl versatate-2-ethylhexyl acrylate
(17) Vinyl acetate-vinyl versatate-vinyl laurate
(18) Vinyl acetate-vinyl versatate-crotonic acid
(19) Vinyl propionate-vinyl versatate
(20) Vinyl propionate-vinyl versatate-crotonic acid
(21) Pivalic acid-vinyl stearate-maleic acid.

To the foregoing colored light-sensitive layers are added coloring agents such as dyes or pigments. The colored light-sensitive material, when used to make a color proof, requires pigments or dyes of yellow, magenta, cyan and black in colors, and in addition, may also use other metallic powders, white pigments, fluorescent pigments and the like. The following are examples of the known pigments and dyes to those skilled in the art, wherein C.I stands for color index.

| Victoria pure blue | C.I. 42595 |
|---|---|
| Auramine | C.I. 41000 |
| Cation brilliant flavin | C.I. basic 13 |
| Rhodamine 6 GCP | C.I. 45160 |
| Rhodamine B | C.I. 45170 |
| Safranine OK70:100 | C.I. 50240 |
| Erioglycine X | C.I. 42080 |
| Fast black HB | C.I. 26150 |
| No. 1201 Lionol yellow | C.I. 21090 |
| Lionol yellow GRO | C.I. 21090 |
| Symuler fast yellow 8GF | C.I. 21105 |
| Benzidine yellow 4T-564D | C.I. 21095 |
| Symuler fast red 4015 | C.I. 12355 |
| Lionol red 7B4401 | C.I. 15830 |
| Fastgen blue TGR-L | C.I. 74160 |
| Lionol blue SM | C.I. 26150 |
| Mitsubishi carbon black MA-100 | |
| Mitsubishi carbon black #30, #40, #50 | |
| Cyanine blue 4920, produced by Dainichi Seika Co. | |
| Seikafast Carmine 1483, produced by Dainichi Seika Co. | |
| Seikafast yellow H-7055, 2400, produced by Dainichi Seika Co. | |

The coloring agent content of the colored light-sensitive layer is preferably 5 to 50% by weight.

The coloring agent/binder ratio in the colored light-sensitive layer may be determined according to a known method to those skilled in the art, taking into account an objective optical density and the colored light-sensitive layer's removability by a developer: for example, the value is preferably 5 to 75% by weight for dyes, and 5 to 90% by weight for pigments.

The thickness of the colored light-sensitive layer may be determined in accordance with a known method to those skilled in the art in consideration of an intended optical density, the types of coloring agents (dyes, pigments, carbon black) used in the colored light-sensitive layer and the contents thereof, but the colored light-sensitive layer should be as thin as possible within the tolerable range to reproduce a high-quality image having a high resolution. Accordingly, the thickness is normally 0.1 to 5μm.

To the colored light-sensitive layer may, if necessary, be added a plasticizer, coatability improving agent and the liked in addition to the above component materials.

Examples of the plasticizer include various low molecular compounds such as phthalates, triphenyl phosphates, maleates, etc., and examples of the coatability improving agent include nonionic surface active agents such as ethyl cellulose, polyalkylene ether etc., and fluorosurfactants.

The colored light-sensitive layer may be divided into two layers: one is a coloring agent layer composed of a coloring agent and a binder, and the other a light-sensitive layer composed of a light-sensitive component and a binder. In this instance, either one of the layers may be present on the support side.

The above colored light-sensitive layer may be coated on a support by any one of various coating methods including the roll coating, reverse roll coating, dip coating, air-knife coating, gravure coating, gravure offset coating, hopper coating, blade coating, rod coating, wire-doctor coating, spray coating, curtain coating, and extrusion coating methods.

Drying of the coated layer is conducted by blowing a heated air against the coated surface. The temperature of the heated air is preferably 30° to 200° C., and more preferably 40° to 140° C. A method wherein the heated air's temperature is kept constant to dry the colored light-sensitive layer is prevailing, but the temperature may be raised by stages. The heated air is supplied onto the coated surface at a rate of preferably 0.1 to 30 meters per second, and more preferably 0.5 to 20 meters per second.

Where the colored light-sensitive layer contains a photopolymerizable compound, in order to prevent the oxygen's hindrance to the polymerization, on the colored light-sensitive layer may be provided an overcoat layer that can be dissolved or can swell in a developer solution. Examples of the resin used for the overcoat layer include poly(vinyl alcohol), poly(ethylene oxide), polyacrylic acid, polyacrylaminde, poly(vinyl-methyl ether), poly(vinyl pyrrolidone), polyamide, gum arabic, glue, gelatin, casein: celluloses such as viscose, methyl cellulose, ethyl cellulose, hydroxyethyl cellulose, hydroxypropylmethyl cellulose, carboxymethyl cellulose, etc.: and starches such as soluble starch and denatured starch.

The above colored light-sensitive film is imagewise exposed in the manner that a color separation screened film is contacted with a colored image-forming material corresponding to each individual color, and the image-forming material is exposed through the screened film to ultraviolet radiation. As the radiation source there may be used a mercury vapor lamp, high pressure mercury vapor lamp, metal-halide lamp, tungsten lamp, xenon lamp, fluorescent lamp or the like.

Subsequently, development is conducted. As a developer solution for use in the formation of a colored image, an alkaline developer solution comprised principally of water as a solvent is preferably used. Examples of the alkali agent used in the developer include inorganic alkali agents such as sodium carbonate, sodium hydrogencarbonate, sodium silicate, potassium silicate, sodium hydroxide, potassium hydroxide, lithium hydroxide, sodium tertiary phosphate, sodium secondary phosphate, potassium tertiary phosphate, potassium secondary phosphate, ammonium tertiary phosphate, ammonium secondary phosphate, sodium metasilicate, sodium bicarbonate, potassium carbonate, ammonium carbonate and ammonium silicate: and organic alkali agents such as mono-, di- and triethanolamines and tetraalkylammonia hydroxide. The alkali agent content of the developer composition is preferably 0.05 to 30% by weight. The above alkaline developer solution may also contain an organic solvent such as ethylene-glycol-monophenyl ether, benzyl alcohol, n-propyl alcohol, etc., a surface active agent, a sulfate, a chelating agent such as EDTA, a defoaming agent such as an organic silane compound, and the like.

As a copying sheet onto which is to be transferred a colored image that has been formed by developing the above imagewise exposed colored light-sensitive film, general printing paper such as art paper, coat paper, fine paper or synthetic paper may be used.

The following are the particular examples of the invention. FIGS. 5(a)-(f) are schematic drawings for explaining the procedure of forming a full color image on a copying sheet.

FIG. 5(a) is a front view, wherein, as shown in FIG. 5(b), a positive film original 5 is brought into contact with the support film 4 side of a colored light-sensitive film 1A, and the film 1A is imagewise exposed to ultraviolet radiation shown by arrow 8 which irradiates from the side of orginal 5. In the drawing, 2 is a light-sensitive layer and 3 is a thermally softening layer as the above intermediate layer.

Next, when the exposed colored light-sensitive film 1A is developed, only an image 6 shown in FIG. 5(c) corresponding to the image 5a of original 5 in FIGS. 5(ia) and 5(b) is formed on support film 4. In the drawing, IB is the developed colored light-sensitive film (hereinafter called 'image sheet').

Then, as shown in FIG. 5(d), the image sheet 1B with its image 6 facing down is superposed upon a copying sheet 7, and both sheets are pressed while being heated. In this process, image 6 is made to stick to copying sheet 7.

When the copying sheet 7 is peeled off from the support film 4 as shown in FIG. 5(e), the thermally softening layer 3 is removed together with the support film 4 from the copying sheet 7, and only the image 6 remains on the copying sheet 7.

When, in the order of black(BK), yellow(Y), magenta(M) and cyan(C), the respective colors' transfer operations are conducted according to the above procedure, a 4 color-pattern-images are superposed on the copying sheet 7 as shown in FIG. 5(f). FIG.(f) shows 4 different colors' patterns are superposed on the identical position, but one or two, or all of the Y, M and C and further BK patterns in combination produce a final color transfer image that is as true as the original.

The transferred image thus obtained (has no resin layer) only has the image 6, and therefore produces no undesirable gloss, thus requiring no matting treatment.

The procedure for the formation of an image on the colored light-sensitive film is as follows: The colored light-sensitive film is exposed through a positive film original 5 as an exposure mask to ultraviolet radiation 8 as shown in FIGS. 5(a) and (b), on the BK, Y, M and C-colored light-sensitive film 1A are formed the respective colors' latent image patterns. When the film is developed, the respective colors' image patterns alone are formed on the support as aforementioned, and the film is then washed and dried, whereby an image sheet 1B shown in FIG. 5(c) is obtained. The above development is a normal development process.

The steps of FIGS. 5(d) to (f) can be performed in succession on a rotary drum. FIG. 1 is a schematic drawing showing the procedure of forming a transfer image on a copying sheet in this manner.

A copying sheet 7 is fixed on a drum 12, which is preheated to a specified temperature: an image sheet 1B is superposed on the copying sheet 7; the drum 12 is rotated in the direction of the arrow: a roller 42, which is preheated to a specified temperature, is brought to press against the colored light-sensitive film 1B by applying pressure to the support film 4 of the image sheet 1B support film 4 is peeled off at a downstream position. Thus, an image 6 is transferred onto the copying sheet 7. When the copying sheet 7 comes to its original position after one revolution of the drum 12, the rotation of the drum is stopped. The process is repeated to superpose the image sheet on the copying sheet to be ready for a subsequent color transfer operation. When this transfer operation through the steps of FIGS. 5(a) to (f) is carried out repeatedly in the order of BK, Y, M and C, a full color transfer image that is as true as the original is formed on the copying sheet 7.

Figure 2:
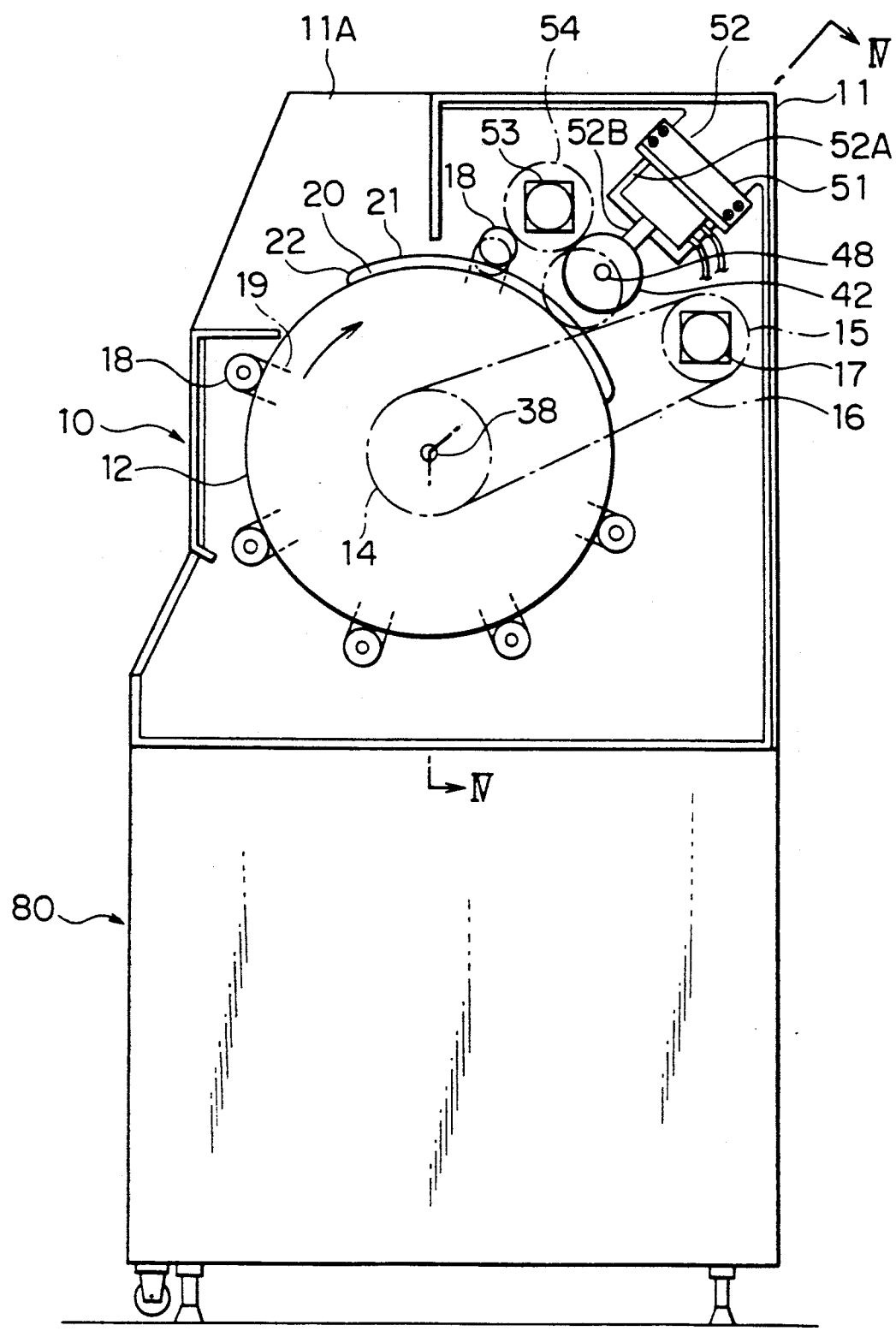
Figure 3:
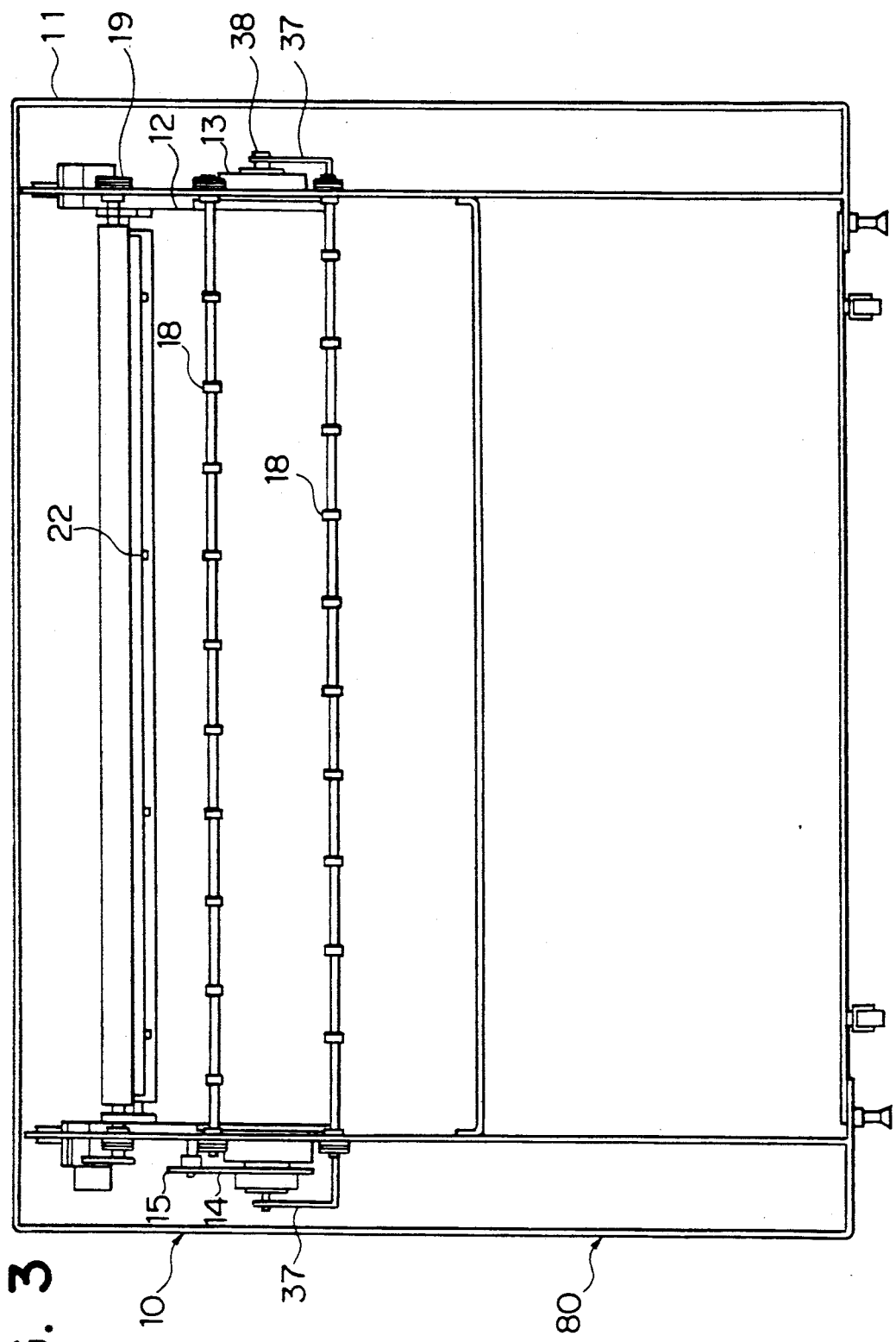
Figure 4:
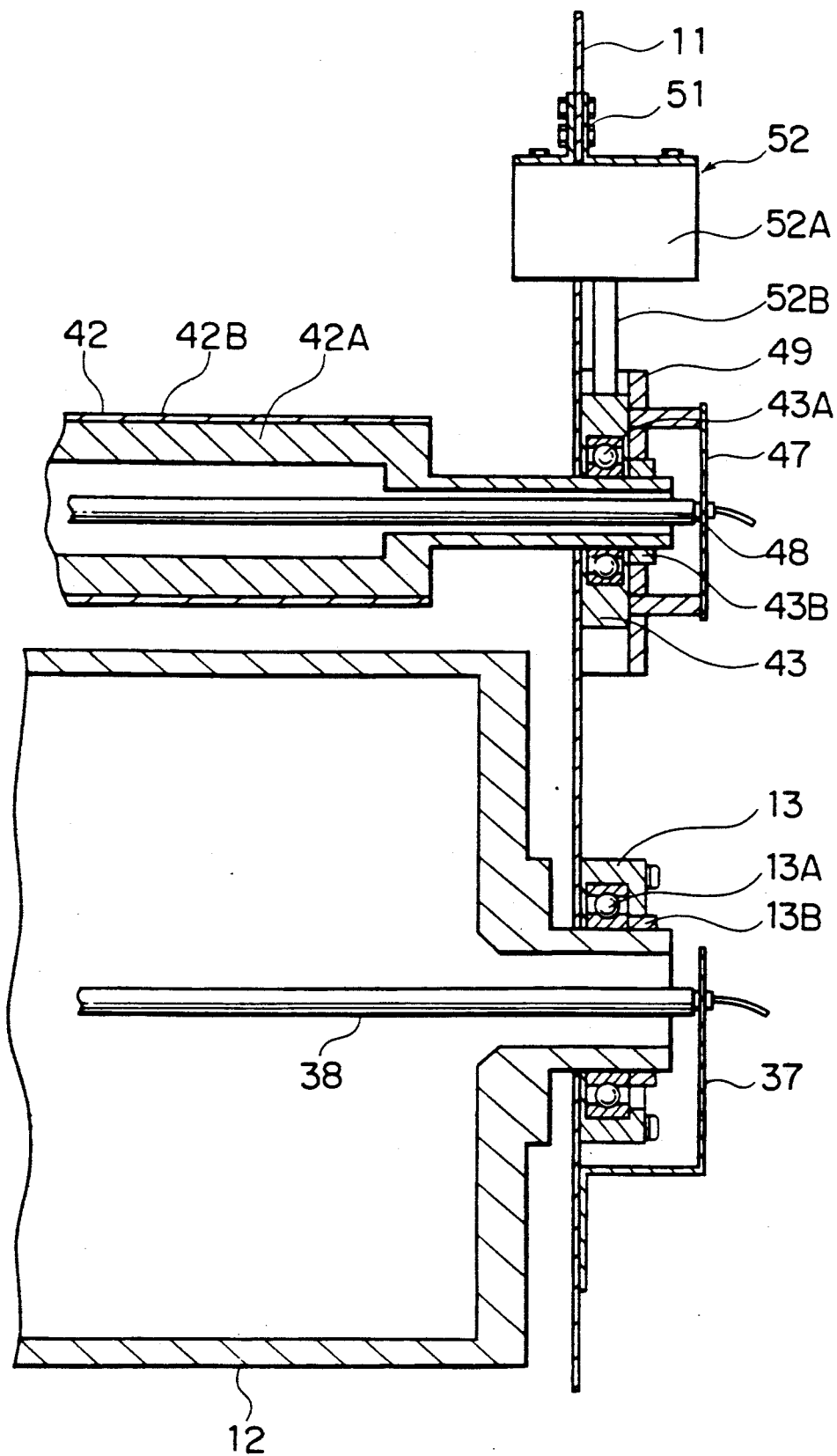

FIG. 2 is an internal front view of the construction of a transfer apparatus, FIG. 3 is an internal left side view of the same, and FIG. 4 is a cross-sectional view as seen in the direction of arrows IV—IV of FIG. 2. The transfer apparatus 10 is provided in a housing 80 having a compressor (not shown) built-in.

An image-transfer drum 12 is provided through a bearing 13 having built-in ball bearing 13A and bearing stopper 13B fixed to the body frame 11, wherein the drum 12 can be driven in the direction of the arrow by a driving motor 17 through chain wheels 14 and 15 and chain 16. Also, in the axis a heater 38 is provided being held by a fixture 37. The drum 12 is so constructed as to make its entire temperature uniformly controllable (50° to 100° C.) by the heater 38. On the periphery of the drum 12 are arranged a plurality of hold-down rollers 18 at given intervals. The bearings of the hold-down rollers slide in the radial direction or drum 12 at the body frame 11 pressure from roller pressure spring 19. The compression spring 19 is resiliently biased to move the foregoing bearings in the pressing direction. Pull-up spacers 21 are provided on both sides of the periphery of the drum 12 to make it possible to break the contact between the hold-down rollers 18 and the drum 12, resisting the compression spring 19.

A pressure roller 42 shown in FIG. 4 comprising an iron axis roller 42A covered with silicone rubber 42B press against the uniformly heated transfer drum 12 and is capable of heating the drum to a required temperature, and the bearing sections at both ends thereof are supported by bearing 43 having built-in ball bearing 43A and bearing stopper 43B. The bearing 43 is mounted so as to slide through a slide guide 49 that is fixed to the body frame 11, and the sliding occurs in the radial direction of the transfer drum. The bearing 43 is directly combined with the movable section 52B of a pressure air cylinder 52 connected to the air compressor in the housing 80, and the fixed section 52A of the pressure air cylinder 52 is fixed by a fixture 51 to the body frame 11. A heater 48 is stationarily provided on the axis of the foregoing heating press roller 42 and is fixed to a fixture 47 that is provided on the slidable bearing 43.

The procedure of locating a copying sheet and an image sheet (not shown) is as follows: The drum 12's surface section corresponding to the front end of the pull-up spacer 21 is designed to be flat such as a location section 20, in FIGS. 6 and 7 to which is mounted pin bar 22. The small-diameter punched holes are provided at a side margin of an image sheet so as to be engaged with the pin bar 22 and wound around the copying sheet on the drum 12, so that the positional relation between the copying sheet and the image sheet can be precisely registered.

The copying sheet and image sheet are pressured to be in close contact with each other by and between the press roller 42 and the drum 12 by the action of the air cylinder 52: after that the image sheet is peeled apart from the copying sheet: and thus the image on the image sheet is transferred onto the copying sheet.

An armor cover 11A (FIG. 7) is provided on the external side of the thus constructed transfer section 10 and the body frame 11 of housing 80, and on the armor cover is arranged a control panel and the like to facilitate and simplify the operation of the apparatus and also to insure safety.

When the location section 20 comes to its original position, a subsequent color transfer is carried out. Thus, only a transferred image composed of BK, Y, M and C colors is formed on the copying sheet, whereby a full color image reproduced as true as the original is obtained.

Subsequently, experiments that were made to examine the quality of the transferred images as follows:

EXPERIMENT EXAMPLE 1

An image sheet was prepared by using the following color image-forming material and the following developer solution.

Four different color image-forming materials were prepared in the manner that a dispersion for the colored light-sensitive layer of the following composition was coated by using a wire bar and then dried so as to make its dry thickness 1.5μm on the ethylene-vinyl acetate copolymer resin surface of a support formed by laminating in an extrusion laminating manner a 25μm-thick ethylene-vinyl acetate copolymer resin layer (EVAFLEX P-1405, vinyl acetate content: 14% by weight. VICAT softening point: 68° C., produced by Mitsui-DuPont Polychemical Corp.) on a 75μm-thick polyethylene terephthalate film.

| | |
|---|---|
| 2,3,4-trihydroxybenzophenone-naphthoquinone-1,2-diazido-4-sulfonate | 0.616 g |
| Vinyl acetate-vinyl versatate copolymer (80:20 wt %, weight average molecular weight: 50,000, 50% methanol solution) | 8.768 g |
| The following pigments | |
| Cyclohexanone | 35.2 g |
| Fluorosurfactant (FC-430, product of 3M) | 0.01 g |

PIGMENTS

Black: Carbon black MA-100 (product of (Mitsubishi Chemical Industies Co.) 0.99 g
Cyan: Cyanine blue 4920 (product of Dainichiseika Color & Chemicals Co.) 0.55 g
Magenta: Seikafast carmine 1483 (product of Dainichiseika Color & Chemicals Co.) 0.68 g
Yellow: Seikafast yellow 2400 (product of Dainichiseika Color & Chemicals Co.) 0.68 g The respective colors' color separation screened positive films were separately superposed on the polyethylene terephthalate film surfaces of the appropriate four different color image forming materials obtained above, and each superposed unit was imagewise exposed for 20 seconds to a 4KW metal halide lamp at a distance of 50 cm therefrom. The image forming material was then developed by being immersed for 30 seconds at 30° C. in the following developer, whereby four different color image patterns were formed and four different color image sheets were obtained.

DEVELOPER

| | |
|---|---|
| KONICA PS plate developer SDR-1 (product of KONICA Corporation) | 20 ml |
| Pelex NBL (product of Kawo Atlas Co.) | 50 ml |
| Distilled water | 400 ml |

A drum 12 made of aluminum and a press roll 42 made of silicone rubber were both heated to 80° C. by the infrared heaters 38 and 48 provided therein: the drum 12 was revolved to carry out image transfer under pressure of 4kg/cm² by the press roll 42; and after that the support of the image sheet was peeled off from the copying sheet (art paper). The peeling was easily made at the interface between the ethylene-vinyl acetate copolymer resin layer and the image. The transfer operations were made in the order of BK, C, M and Y, to thereby form a color proof image composed of 4 different colors on the art paper. The obtained color proof image was free of any undesirable gloss, and had a high quality which closely resembled the image of those prints prepared by ordinary offset printing.

The transfer time required for preparing one color proof was 4 minutes. The dimensions of the transfer apparatus including the housing 80 shown in FIGS. 2 and 3 are 800 mm in width, 1300 mm in height, and 600 mm in depth.

As has been described above, the respective color transfer image patterns are formed in succession on the rotatable drum on a semi-continual basis, so that the transfer time required for preparing a color proof is shorter and its transfer work is more efficient than the following comparative example, and the present apparatus is smaller.

COMPARATIVE EXAMPLE 1

Figure 12A:
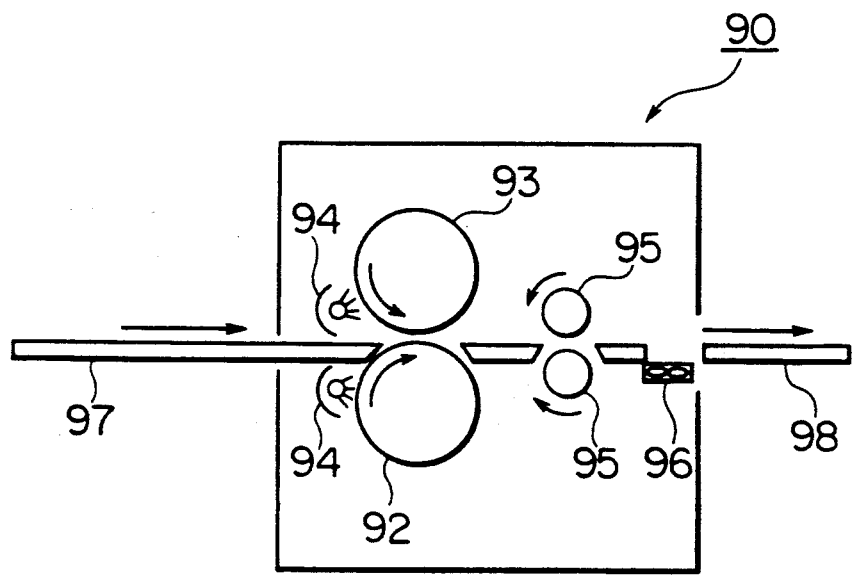

For comparison, an image sheet which is the same as in the above example of the present invention was used to prepare a color proof by using a conventional transfer apparatus shown in FIG. 12A. The dimensions of the apparatus, including feeding tray 97 and receiving tray 98, are 1090 mm in width, 1090 mm in height and 1300 mm in depth. And peeling of the support film was conducted on the receiving tray 9&. As a result, the image on the copying sheet was stripped off locally to remain on the support film side, so that the image on the obtained color proof looked poor unlike the original image. The time required for the transfer was 8 minutes.

COMPARATIVE EXAMPLE 2

Figure 10A:
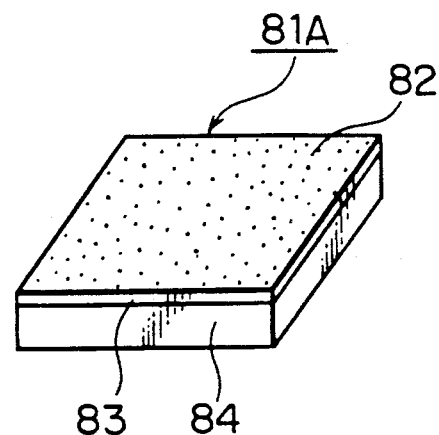
FIGS. 10(a), 10(b) and 10(c) are schematic perspective views showing the steps of preparing an image sheet.
Figure 10B:
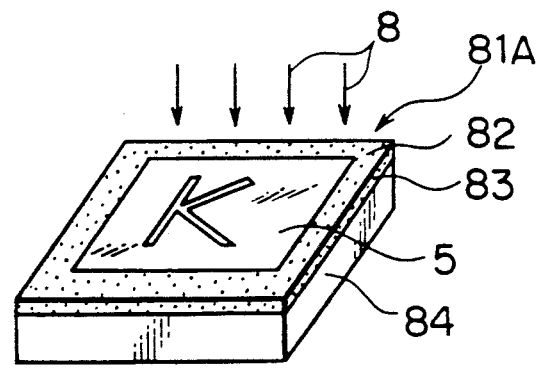
Figure 10C:
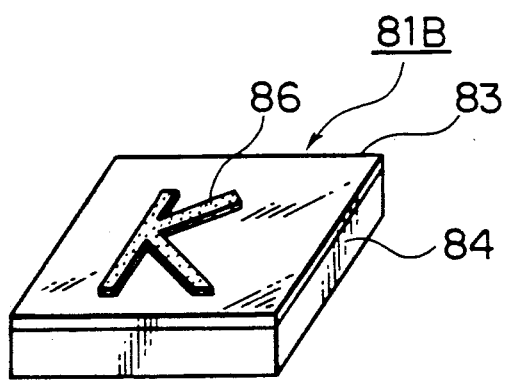

The transfer apparatus shown in FIG. 12A and a prior art image sheet shown in FIG. 10(c) were used to prepare a color proof in accordance with the steps of FIGS. 11(a) to (d). The time required for the transfer was 15 minutes, much longer than in the above Comparative Example 1. The obtained image had a glossy surface due to the presence of a photopolymerizable image-receiving layer 87b that was hardened by ultraviolet irradiation, and the gloss, even when subjected to matting treatment, made the image look even poorer than in Comparative Example 1.

EXPERIMENT EXAMPLE 2

An image sheet was prepared with the following colored light-sensitive film and a developer solution having the following composition.

Four different color image-forming materials were prepared in the manner that a dispersion for the colored light-sensitive layer having the following composition was coated by using a wire bar and then dried so as to make its dry thickness 1.5μm on the ethylene-vinyl acetate copolymer resin layer surface of a support formed by an extrusion laminating a 30μm-thick ethylene-vinyl acetate copolymer resin layer (EVAFLEX P-1907, vinyl acetate content: 19% by weight, VICAT softening point: 59° C., produced by Mitsui-DuPont Polychemical Corp.) on a 75μm-thick polyethylene terephthalate film.

| | |
|---|---|
| Dispersion composition for colored light-sensitive layer: | |
| An alkali-soluble polymer having the following | 12 g |

-continued

| Dispersion composition for colored light-sensitive layer: | |
|---|---|
| formula (weight average molecular weight: 17,000, 50% methyl cellosolve solution) | |

$$+CH_2-CH)_l+CH_2-CH)_m+CH_2-CH)_n$$
$$\quad\quad\quad\quad\quad\quad | \quad\quad\quad\quad | $$
$$\quad\quad\quad\quad\quad\quad CN \quad\quad C-OCH_3$$
$$\quad\quad\quad\quad\quad\quad\quad\quad\quad\quad\quad\quad ||$$
$$\quad\quad\quad\quad\quad\quad\quad\quad\quad\quad\quad\quad O$$

$$C-N-\bigcirc-OH$$
$$|| \ |$$
$$O \ H$$

(l:m:n = 10:10:80)

| | |
|---|---|
| Pentaerythritol tetraacrylate | 4.3 g |
| Michler's ketone | 0.04 g |
| Benzophenone | 0.25 g |
| p-Methoxyphenol | 0.01 g |
| Methyl cellosolve | 94 g |
| Fluorosurfactant (FC-430, product of 3M) | 0.01 g |
| The following pigments | |
| Pigments: | |
| Black: | |
| Carbon black MA-100 (product of Mitsubishi Chemical Industries Co.) | 1.98 g |
| Cyan: | |
| Cyanine blue 4920 (product of Dainichiseika Color & Chemical Co.) | 1.10 g |
| Magenta: | |
| Seikafast carmine 1483 (product of Dainichiseika Color & Chemicals Co.) | 1.36 g |
| Yellow: | |
| Seikafast yellow 2400 (product of Dainichiseika Color & Chemicals Co.) | 1.36 g |

The above alkali-soluble polymer composition was synthesized by the following method.

In a 1-liter four-neck flask were put 8.85 g of hydroxyphenyl methacrylamide, 2.65 g of acrylonitrile, 33.11 g of methyl acrylate and 1.64 g of azobisisobutylonitrile (polymerization initiator) with 200 g of ethyl alcohol used as a solvent, and the reaction thereof took place at 77° C. for 6 hours. After that, 75 g of methyl cellosolve were added thereto to stop the reaction, and the ethyl alcohol was distilled off at 60° C. for 3 hours, whereby about 95 g of a 50% methyl cellosolve solution of the foregoing polymer composition were obtained.

Subsequently, on each of the respective colored light-sensitive layers was coated by using a wire bar the following composition-having liquid for the overcoat layer so as to make its dry thickness 0.3μm, and then dried, whereby four different color image forming materials were prepared.

| Liquid composition for overcoat layer | |
|---|---|
| Polyvinyl alcohol (GL-05, product of Nippon Synthetic Chemical Industry Co.) | 6 g |
| Distilled water | 97 g |
| Methanol | 3 g |

On the overcoat layer surface of each of the four different color image forming materials was superposed an appropriate color separation negative film, and the superposed unit was exposed for 20 seconds to a 4KW metal halide lamp positioned at a distance of 50 cm therefrom, and then developed by being immersed in the following developer solution for 30 seconds, whereby four different color image patterns were formed.

| Developer: | |
|---|---|
| Sodium carbonate | 15 g |
| Surface active agent (Pelex NBL, produced by Kawo Atlas Co.) | 50 g |
| Distilled water | 1000 g |

Others are the same as those in Experiment Example 1.

The obtained color proof image quality was as much excellent as what was obtained in Experminent Example 1.

Figure 6:
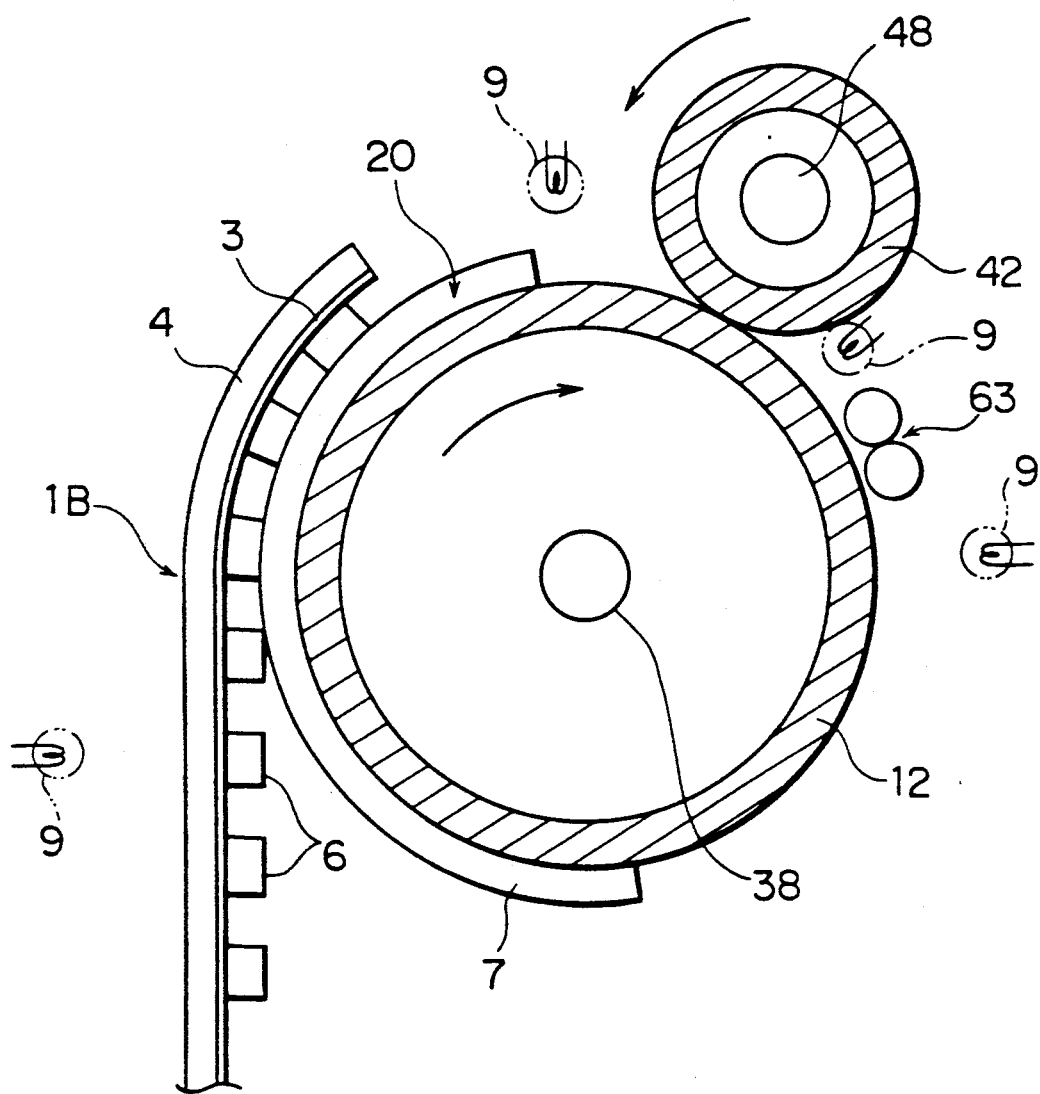
FIG. 6 is a schematic front view of a principal part of another example of the transfer apparatus of the present invention.
Figure 7:
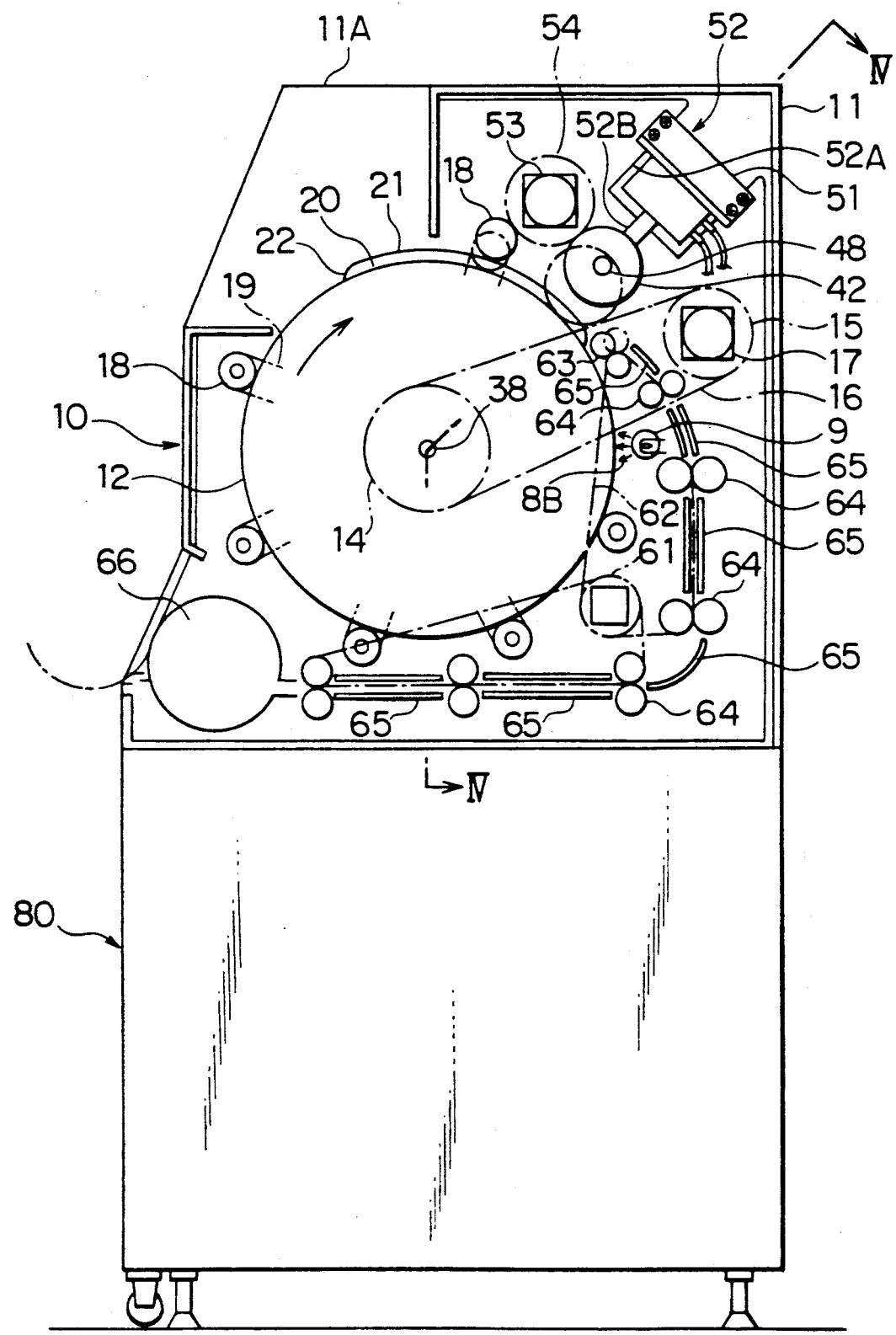
FIG. 7 is a front view of the inside of the transfer apparatus of FIG. 6.

Other examples of the invention are described below:

As was explained in FIG. 5(e), when support film 4 is stripped off from copying sheet 7, removal layer 3 is removed together with the support film 4 from the copying sheet 7, and an image 6 alone remains on the copying sheet 7. In this example of the invention, in order that the copying sheet is then exposed to a light 8B as shown in FIG. 5(e)' to decompose the undecomposed o-naphthoquinonediazide compound to make the yellow color disappear, a light source 9 is arranged around the transfer drum 12 as shown in FIG. 6. Even in the apparatus shown in FIGS. 6 and 7, the location of the copying sheet and image sheet, and the image transfer operation are conducted in similar manner to the example in FIGS. 1 and 2.

In this example, a copying sheet and an image sheet are pressed to come in close contact with each other between press roller 42 and drum 12 by the action of air cylinder 52, and then the image sheet is peeled apart from the copying sheet by a peeling roller 63 provided at a downstream position of the press roller 42. The image of the image sheet is transferred onto a copying sheet, and the remaining image sheet is guided by a plurality of guiding walls 65 and transported by a plurality of transport rollers 64 to a collection section 66. The peeling roller 63 is driven together with the plurality of transport rollers 64 through a drive transmission wheel and chain 62 by a driving motor 61, and transport between these rollers is carried out by walls 65.

The copying sheet having thereon an image transferred from the image sheet from which the support film is stripped off is exposed on the drum 12 at a downstream position beyond the peeling roller 63 to the light 8B from a light source 9 to thereby cause the yellow color of the o-naphthoquinonediazide compound to disappear.

Figure 8:
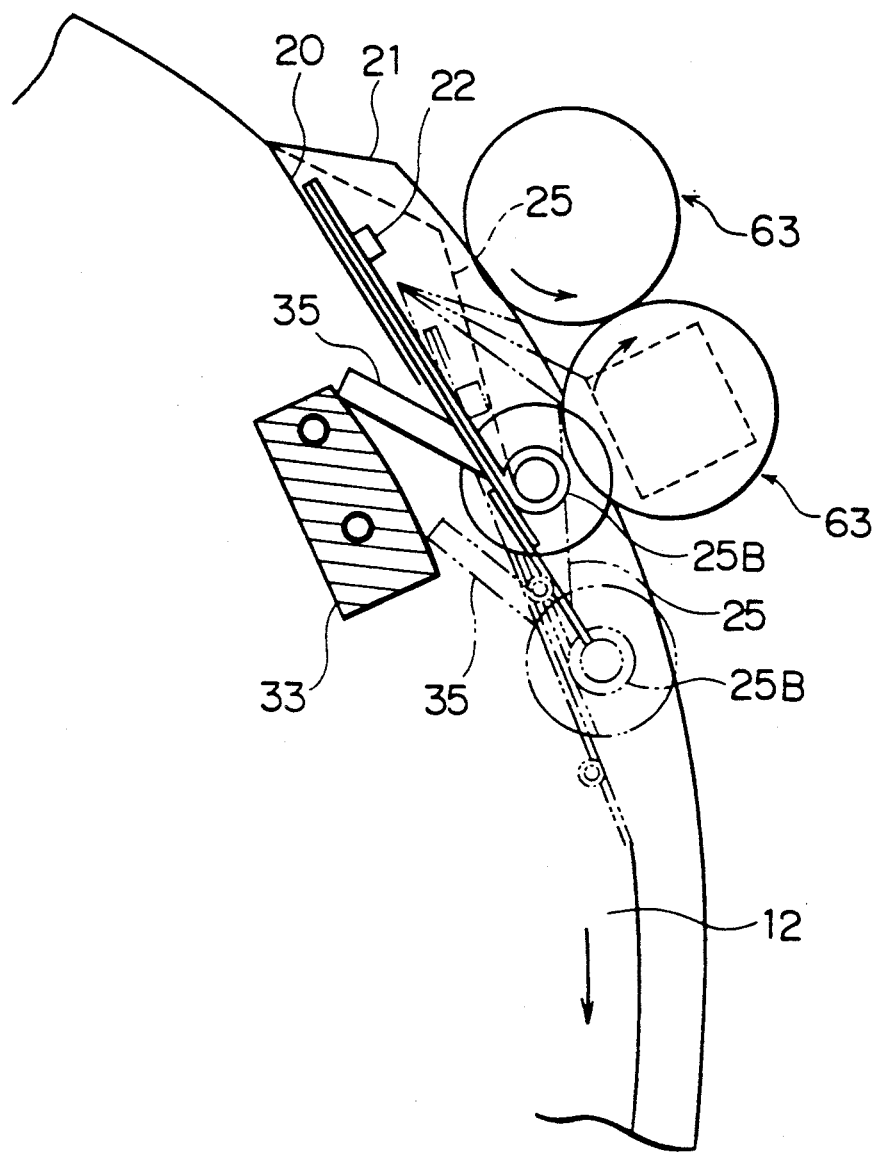
FIG. 8 is an enlarged front view of a principal part of a support-film peeling mechanism of the present invention.
Figure 9:
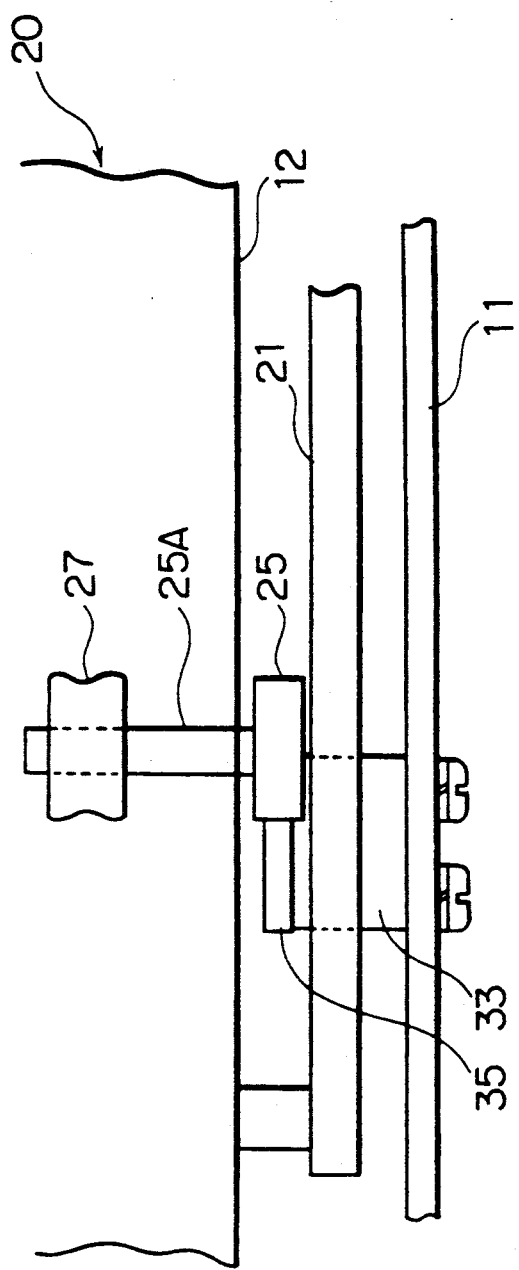
FIG. 9 is an enlarged perspective view of the same principal part.

For the peeling of the image sheet there is employed a mechanism that is seen in the enlarged partial front view of FIG. 8 and in the enlarged partial perspective view of FIG. 9.

A peeling plate opening and closing cam 33 is provided inside the body frame 11. When location section 20 is brought to this position by the rotation of the drum 12, a cam follower lever 35 pivotably mounted to the location section 20 is rotated clockwise, while being moved from the solid-lined position to the imaginary-lined position, by the peeling plate opening-closing cam 33. The peeling plate 25 that is fixed to the cam follower lever 35 and resiliently biased in the counterclockwise direction by a return coil spring 25B rotates clockwise by the clockwise rotation of the cam follower lever 35, and at the same time the peeling roller 63 moves from the solid-lined position to the imaginary-lined position in FIG. 7, and the image sheet peeled by the peeling plate 25 is led to between a pair of peeling rollers 63 which rotate in the directions opposit to each other and then guided by the guiding walls 65 shown in FIG. 7 to be transported by the transport roller 64. In FIG. 9, 27 is a bearing to support the peeling plate pivot 25A.

The drum 12 and press roll 42 are heated by heaters 38 and 48, respectively. The heat softens the removable layer 3 (indicated in FIG. 5(a) to (e)), and before the layer is cooled, the support film 4 (indicated in FIG. 5) is peeled off, so that the peeling can be easily conducted. Thus, an image 6 (indicated in FIGS. 5(e) and (f)) alone is securely fixed to the copying sheet. In this instance, there occurs no trouble that the copying sheet is plucked off locally by the support film of the image sheet.

Figure 12B:
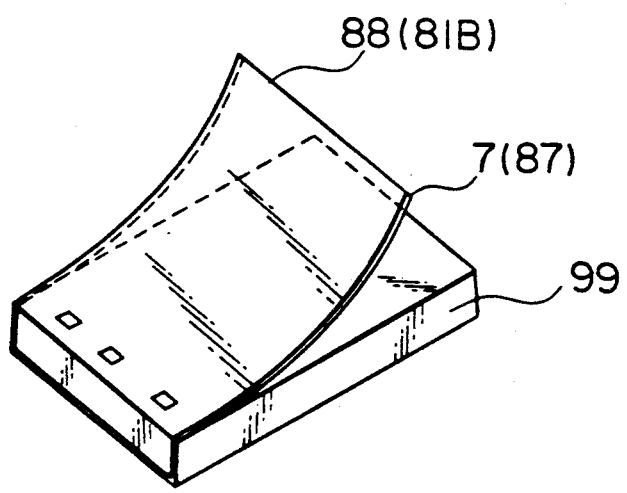

As has been described, a copying sheet and an image sheet are set to the rotatable drum, and image transfer, peeling of the support film and exposure to light are carried out with the drum being rotated, so that the feeding tray 97 and receiving tray 98 shown in FIG. 12 are not necessary, thus enabling the apparatus to be space saving. Furthermore, each time when the drum makes one revolution, a subsequent color image sheet is mounted thereto to enable the transfer operation to be carried out successively and the operator to carry out the transfer work at one place, so that the work is time saving and its efficiency is improved. In addition, the exposure which follows the transfer can be conducted in the same apparatus, so that no special exposure equipment is necessary. Accordingly, the space for the apparatus including an exposure device and the working hours can be lessened.

Next, the quality of a transferred image obtained by using the transfer apparatus shown in FIG. 6 to FIG. 9 is explained.

EXPERIMENT EXAMPLE 3

A colored light-sensitive layer dispersion and color image-forming materials were prepared in the same procedure as that of Experiment example 1 except that p-cresyl-formaldehyde novolac-naphthoquinone-1,2-diazido-4-sulfonate was used instead of 2,3,4-trihydroxybenzophenone-naphthoquinone-1,2-diazido-4-sulfonate.

The exposure method and developer which were shown in Experiment Example 1 were used to form a color image. The color image formed on the image sheet was transferred as follows:

A drum 12 made of aluminum having a thickness of 20 mm and a diameter of 300 mm and a press roll 42 made of silicone rubber having a diameter of 80 mm were heated to 80° C. with infrared heaters 38 and 48 built-in, respectively, and the drum 12 was rotated at a circumferential speed of 90 cm/min to perform image transfer under pressure of 4 kg/cm$^2$ of the press roll 42, and immediately after the image sheet passes the press roll 42, the support film of the image sheet was peeled off from the copying sheet (art paper). The peeling was easily performed at the interface between the ethylene-vinyl acetate copolymer resin layer and the image.

After the above peeling, the copying sheet was exposed to the light of an 1 KW high pressure mercury vapor lamp as light source 9 at a distance of 10 cm therefrom to decompose the underdecomposed o-naphthoquinonediazide compound to thereby make the yellow color attributed thereto disappear. The time required to make one color proof was four minutes. The dimensions of the transfer apparatus, including the housing 80 of FIG. 2 and FIG. 3, are 800 mm in width, 1300 mm in height and 600 mm in depth.

Thus, since the color image transfer is carried out in succession semicontinually on the rotatable drum and the exposure is made inside the apparatus, the transfer time including exposure time required for color proof making is shorter, the transfer operation can be carried out more efficiently, and the space for the transfer apparatus can be smaller than those of the comparative example that is described below:

COMPARATIVE EXAMPLE 3

A color proof was prepared with the same image sheet as that in the above example by using a conventional transfer apparatus that is shown in FIG. 12A. The dimensions of the transfer apparatus 90 including feeding tray 97 and receiving tray 98 are 800 mm in width, 1300 mm in height and 1200 mm in depth. Peeling of the support film was conducted on the receiving tray 98. The time required for transfer operation was 8 minutes in total. The obtained image was yellowish. In order to make the yellow color disappear, it was necessary to separately use a 1 KW high pressure mercury vapor lamp to irradiate the image for 60 seconds at a distance of 10 cm therefrom.

In the above example, the irradiation to the image is conducted after peeling the support film apart from the image sheet. However, since the support film is transparent, the irradiation can be made, as shown with the imaginary-lined circles 9 in FIG. 6, at a position between the location section 20 and the press roller 42 or at a position between the press roller 42 and the peeling rollers 63, or can also be made to the image sheet immediately before being superposed on a copying sheet. The light irradiation may be conducted only once after completion of the four colors' transfer operation. In the above instance, the image sheet and the copying sheet together are wound around the drum 12 for transferring. However, the image sheet may be laid upon the copying sheet immediately before the pressure roller 42, and the support film of the image sheet may be peeled apart immediately after passing the pressure roller 42. Light source 9 for the irradiation is not limited to a single lamp but may be two or more lamps arranged in the copying sheet moving direction.

In the above example, heating and pressure are used in combination for image transfer, but pressure alone may be used therefor. In this instance, the heaters 38 and 48 shown in FIGS. 1, 2, 4, 6 and 7 may be omitted. In the case of a transfer operation employing pressure alone, the image sheet used may be one identical with that for the image transfer employing both heating and pressure, but is preferably of a light-sensitive composition whose binder (a macromolecular compound) has a softening point of not more than 60° C. In order to improve the transferrability with application of pressure, it is preferable to incorporate into the light-sensitive composition a viscosity donor such as petroleum resin, liquid polybutadiene, long-chain alkylphenol resin or the like within limits not to impair the image formation.

The examples of the invention have been described above, but the above examples may be variously changed on the basis of the idea of the invention. For example, the image to be formed may be used for the formation of a full color image composed of four colors, a monocolor image or a color image composed of two colors, and may also be used for the image formation in small-quantity production other than proof making. The cylindrical drum 12 may be replaced by a different other rotatable one in an arbitrary form such as oval or regular polygon. Alternatively, the image transfer is allowed to be performed on an endless belt as a running-around pressure receiver. Also, an image sheet prepared by reversal or normal processing from a negative original may be used.

The present invention is so designed that a transfer medium comprising a support having an image alone formed thereon is used: the transfer medium is superposed on a copying sheet that is set to a rotatable pressure-receiving body; and image transfer is conducted while the pressure-receiving body is being rotated. Therefore, no undesirable component is present together with the transferred image, so that the image is free of an undesirable nature such as gloss. Further, the use of the rotatable pressure-receiving body enables the transfer apparatus to be of a compact type: and return of the copying sheet to its original superposing position is effective to minimize the transfer work space and also to shorten the time required for image transfer. Consequently, a transfer image closely resembled to an original image can be obtained in addition to the improvement of the image transfer efficiency.

The image transfer apparatus according to the invention is so designed as to make light irradiation to a formed image on a copying sheet set to a pressure-receiving body that is made rotatable, so that the image transfer and the light irradiation can be conducted inside the same apparatus. Therefore, it is unnecessary to install a separate light irradiation device. Also, by making the pressure-receiving body rotatable, the copying sheet returns to the pressure-receiving body's initial setting position to enable minimization of the working space. As a result, the space required for the apparatus, including the light irradiation device, can be lessened, and the time required for the image transfer can be shortened.

What is claimed is:

1. A method for transferring an image from a transfer medium onto a recording sheet without gloss being transferred with the image, comprising the steps of:
   providing on said transfer medium a support layer with a colored light sensitive layer formed thereover;
   positioning an intermediate removable layer between said support layer and said light sensitive layer;
   exposing said light sensitive layer to a predetermined image, to form a latent image thereon;
   developing only said latent image, other portions of said light sensitive layer remaining undeveloped;
   removing said undeveloped portions of said light sensitive layer;
   placing said recording sheet on a rotatable sheet carrying member;
   superposing said transfer medium over said recording sheet with said developed latent image facing said recording sheet;
   pressing said transfer medium and said recording sheet onto said rotatable sheet carrying member while rotating said rotatable sheet carrying member to transfer only said developed latent image to said recording sheet; and
   removing said intermediate removable layer and said support layer from said recording sheet whereby only said developed latent image is transferred to said recording sheet.

2. The method of claim 1, further comprising heating said transfer medium.

3. A method of claim 2 wherein said pressing step includes heating said transfer medium.

4. Apparatus for transferring an image formed on a transfer medium to a recording sheet, comprising:
   a support layer on said transfer medium;
   an intermediate removable layer formed over said support layer;
   a light sensitive layer formed over said intermediate removable layer;
   means for exposing said light sensitive layer to a predetermined image, thereby forming a latent image of said predetermined image on said light sensitive layer;
   developing means for developing only said latent image, said developing means leaving undeveloped the non-exposed light sensitive layer other than said predetermined image;
   removal means for removing said undeveloped light sensitive layer;
   a rotatable recording sheet carrying member for carrying said recording sheet thereon;
   means for superposing said transfer means over said recording sheet with said developed predetermined image facing said recording sheet;
   pressing means for pressing said transfer medium and said recording sheet onto said rotatable recording sheet carrying member to transfer only said developed predetermined image to said recording sheet; and
   means for removing said intermediate removable layer and said supporting layer from said recording sheet.

5. The apparatus of claim 4, further comprising heating means for heating said transfer medium.

6. The apparatus of claim 4 wherein said pressing means comprises a pressing roller.

7. The apparatus of claim 6 further comprising heating means provided in said pressing roller.

* * * * *